United States Patent [19]
Plötz et al.

[11] Patent Number: 5,921,385
[45] Date of Patent: Jul. 13, 1999

[54] HOUSING FOR PERSONAL COMPUTER CARDS

[75] Inventors: Stefan Plötz, Nachrodt-Wiblingwerde; Walter Gross, Schleiden-Olef, both of Germany

[73] Assignee: Stocko Metallwarenfabriken, Wuppertal, Germany

[21] Appl. No.: 08/924,290

[22] Filed: Sep. 5, 1997

[30] Foreign Application Priority Data

Sep. 6, 1996 [DE] Germany ............... 296 15 553 U

[51] Int. Cl.⁶ .................................................. B65D 85/90
[52] U.S. Cl. .................................. 206/307; 206/706
[58] Field of Search ............................ 206/307, 308.1, 206/308.2, 308.3, 387.1, 387.11, 449, 454, 456, 706, 722, 723, 724

[56] References Cited

U.S. PATENT DOCUMENTS

| | | |
|---|---|---|
| 3,775,643 | 11/1973 | Schachnow et al. . |
| 4,120,400 | 10/1978 | Kotyuk ................................ 206/468 |
| 4,805,769 | 2/1989 | Soltis et al. ....................... 206/308.2 |
| 5,334,046 | 8/1994 | Brouillette et al. . |
| 5,417,328 | 5/1995 | Ritter .................................. 206/449 |
| 5,469,332 | 11/1995 | Alvite . |

FOREIGN PATENT DOCUMENTS

| | | |
|---|---|---|
| 4428717 | 3/1995 | Germany . |
| 19519346 | 1/1996 | Germany . |
| 29601265 | 8/1996 | Germany . |
| 439995 | 2/1992 | Japan . |

*Primary Examiner*—Jim Foster
*Attorney, Agent, or Firm*—Robert W. Becker & Associates

[57] ABSTRACT

A housing for a personal computer card has a U-shaped plastic frame including flexible lateral arms and a connecting stay connecting the lateral flexible arms. The flexible lateral arms and the connecting stay define a plane of the plastic frame and delimit an inner receiving space for a personal computer card. The U-shaped plastic frame has an open end opposite the connecting stay for inserting a personal computer card into the plastic frame. The plastic frame has a guide arrangement open inwardly relative to the inner receiving space. The guide arrangement positions and secures the personal computer card in the plastic frame laterally and in a direction perpendicular to the plane of the plastic frame after insertion of the personal computer card into the inner receiving space.

11 Claims, 4 Drawing Sheets

HOUSING FOR PERSONAL COMPUTER CARDS

BACKGROUND OF THE INVENTION

The present invention relates to a housing for personal computer cards (PC cards), especially PCMCIA cards, including a printed circuit board that is inserted into a plastic frame and fastened thereto.

From German Offenlegungsschrift 44 28 717 a housing for a personal computer card is known in which the printed circuit board is arranged between two frame halves that are connected to one another by interlocking grooves forming a snap connection and after assembly of the PC card, secures the printed circuit board without any further fastening means such as adhesives, fusing, or other time consuming or complicated connecting procedures or systems. This housing is comprised preferably of stainless steel in order to provide the required stiffness and stability as well as to provide an electrically conducting, shielding enclosure for the electronic components. The disadvantage of this design is that with such a steel housing alone a secure fixation of the printed circuit board within the housing is impossible. In practice, the printed circuit board is therefore first inserted into a plastic frame which is then enclosed in the outer metal casing in order to provide for an effective enclosure of the printed circuit board in the housing with the required stiffness and stability while providing secure fixation over the entire service life.

The secure fastening of the printed circuit board within the plastic frame is, in general, achieved by using an adhesive. For this purpose, the plastic frame has in cross-section an L-shaped receiving member for the printed circuit board to which during the manufacturing process a suitable adhesive is applied. Subsequently, the printed circuit board is placed onto the L-shaped receiving member from above and, after curing of the adhesive, the printed circuit board with the attached plastic frame is then introduced into the aforementioned metal housing. A disadvantage of this design is that the application of the adhesive is complicated, that the applied adhesive is prone to soiling by binding dust, and, when the adhesive is applied carelessly, the electronic function may be impeded. Furthermore, this manufacturing process is technically complicated and time-consuming. Due to the increased need for portable computers, such as notebooks, the requirements with regard to the manufacture of electronic auxiliary storage devices in the form of PC cards have become more demanding. Such storage devices are to be inserted into a port and connected with a plug-in connection to the computer whereby, depending on the design of the electronic configuration, different expansion slots must be provided for the portable computer.

It is therefore an object of the present invention to eliminate the aforementioned disadvantages and to provide a simple possibility for introducing a printed circuit board into a plastic frame and to exactly position the printed circuit board therein without having to use an adhesive or a mechanical connection by rivets or screws. It should also be possible to remove the printed circuit board, if desired, from the plastic frame in order to provide an exchangeable printed circuit board so that when the printed circuit board is damaged, for example, when a faulty soldering joint is present, it is no longer necessary to exchange and dispose of the entire PC card.

SUMMARY OF THE INVENTION

A housing for a personal computer card according to the present invention is primarily characterized by:

A U-shaped plastic frame comprised of flexible lateral arms and a connecting stay connecting the flexible lateral arms, wherein the flexible lateral arms and the connecting stay define a plane of the plastic frame and delimit an inner receiving space for a personal computer card;

the U-shaped plastic frame having an open end opposite the connecting stay for inserting a personal computer card into the plastic frame;

the plastic frame having a guide arrangement open inwardly relative to the inner receiving space;

wherein the guide arrangement positions and secures the personal computer card in the plastic frame laterally and in a direction perpendicular to the plane of the plastic frame after insertion of the personal computer card into the inner receiving space.

The guide arrangement is preferably a continuous groove that extends along the flexible lateral arms and along the connecting stay and opens inwardly.

Preferably, the guide arrangement is a discontinuous groove that extends along the flexible lateral arms and along the connecting stay and opens inwardly, wherein the discontinuous groove is comprised of bottom supports and counter holders. In a prefered embodiment, the counter holders are displaced relative to the bottom supports in a direction of longitudinal extension of the discontinuous groove.

Advantageously, at least one of the bottom supports is located on each one of the flexible lateral arms and projects inwardly into the inner receiving space.

Preferably, a support surface of the bottom supports extends at the same level as the first side surface of the discontinuous groove, such that the support surface is an inwardly projecting continuation of the first side surface of the groove.

At least one of the counter holders is located on at least one of the flexible lateral arms and the connecting stay and projects inwardly into the inner receiving space.

A support surface of the counter holder extends at the same level as a second side surface of the discontinuous groove, such that the support surface is an inwardly projecting continuation of the second side surface of the groove.

The connecting stay has an inward projection for cooperating with a cutout provided at the leading end of the personal computer card received in the inner receiving space, wherein in the inward projection provides an coding system together with the cutout at the personal computer card.

The flexible lateral arms have coding projections or coding cutouts for cooperating with coding cutout or coding projections at lateral edges of the personal computer card.

Each one of the flexible lateral arms has preferably an extension at the open end of the plastic frame, wherein the extension has a forked end for engaging securing projections at a contact strip of the personal computer card inserted into the inner receiving space.

Preferably, the housing further comprises a metal casing for receiving the plastic frame having a personal computer card inserted therein.

According to the present convention, the plastic frame is open at one side, preferably at the side where the contact strip of the personal computer card is located upon insertion and is substantially U-shaped with flexible lateral arms. The plastic frame provides an inwardly open guide arrangement for the printed circuit board. This guide arrangement, after insertion of the printed circuit board into the plastic frame, positions and secures in the upward and downward direction (the frame being arranged horizontally) the circuit board within the plastic frame. Preferably, the guide arrangement for the circuit board has the shape of a continuous or discontinuous guide groove whereby the discontinuous guide groove preferably comprises bottom supports and upper counter holders that are displaced relative to one another in the longitudinal direction of the guide groove. This provides the possibility to insert the printed circuit board into the injection molded plastic frame without requiring an adhesive because the bottom supports and the upper counter holders form a continuous or discontinuous guide groove, for example, in the form of displaced projections (bottom supports, counter holders) in the case of a discontinuous guide groove, which ensure a save and secure positioning and securing of the circuit board in the frame.

According to an advantageous embodiment of the invention, at least one inwardly projecting support for the circuit board can be provided at each lateral arm of the plastic frame in order to facilitate insertion of the circuit board by improving guiding as well as to improve the securing action within the plastic frame. Advantageously, the supports extend at the same level as the lower guide or side or side surface of the guide arrangement, especially a guide groove, and project inwardly.

In the same manner, upper inwardly projecting counter holders can be provided at one or more sides of the plastic frame whereby preferably the counter holders form a projection of the upper guide side surface of the guide groove extending inwardly.

In order to ensure that for a great number of embodiments of circuit boards the correct plastic frame can be provided, according to an expedient embodiment of the invention it is suggested to provide the plastic frame and the circuit board with cooperating projection/cutout arrangements in the area of the guide groove at the connecting stay so as to provide a coding system. In addition thereto, the same type of coding can also be provided at the lateral arms of the plastic frame and the lateral edges of the printed circuit board, i.e., cooperating projections/cutout arrangements.

The actual contacting area of a personal computer card is provided by a contact strip at the trailing end of the circuit board in regard to insertion into the plastic frame. It is thus necessary, given the frequent insertion and removal of such a personal computer card, that the contact strip is securely fixed in position within the plastic frame. For this prupose it is advantageously suggested to extend the lateral arms of the plastic frame such that they can securely engage the contact strip. Accordingly both lateral arms are provided with a forked end which engages securing projections of the contact strip at either end thereof for fixation of the contact strip within the plastic frame. The inner arm of the forked end may contact the end face of the printed circuit board in order to provide for a securing action against axial displacement of the circuit board within the plastic frame.

In a manner known per se, the thus embodied housing of the invention can be inserted into an outer metal housing.

BRIEF DESCRIPTION OF THE DRAWINGS

The object and advantages of the present invention will appear more clearly from the following specification in conjunction with the accompanying drawings, in which.

DESCRIPTION OF PREFERRED EMBODIMENTS

The present invention will now be described in detail with the aid of several specific embodiments utilizing FIGS. 1–4.

Figure 1:
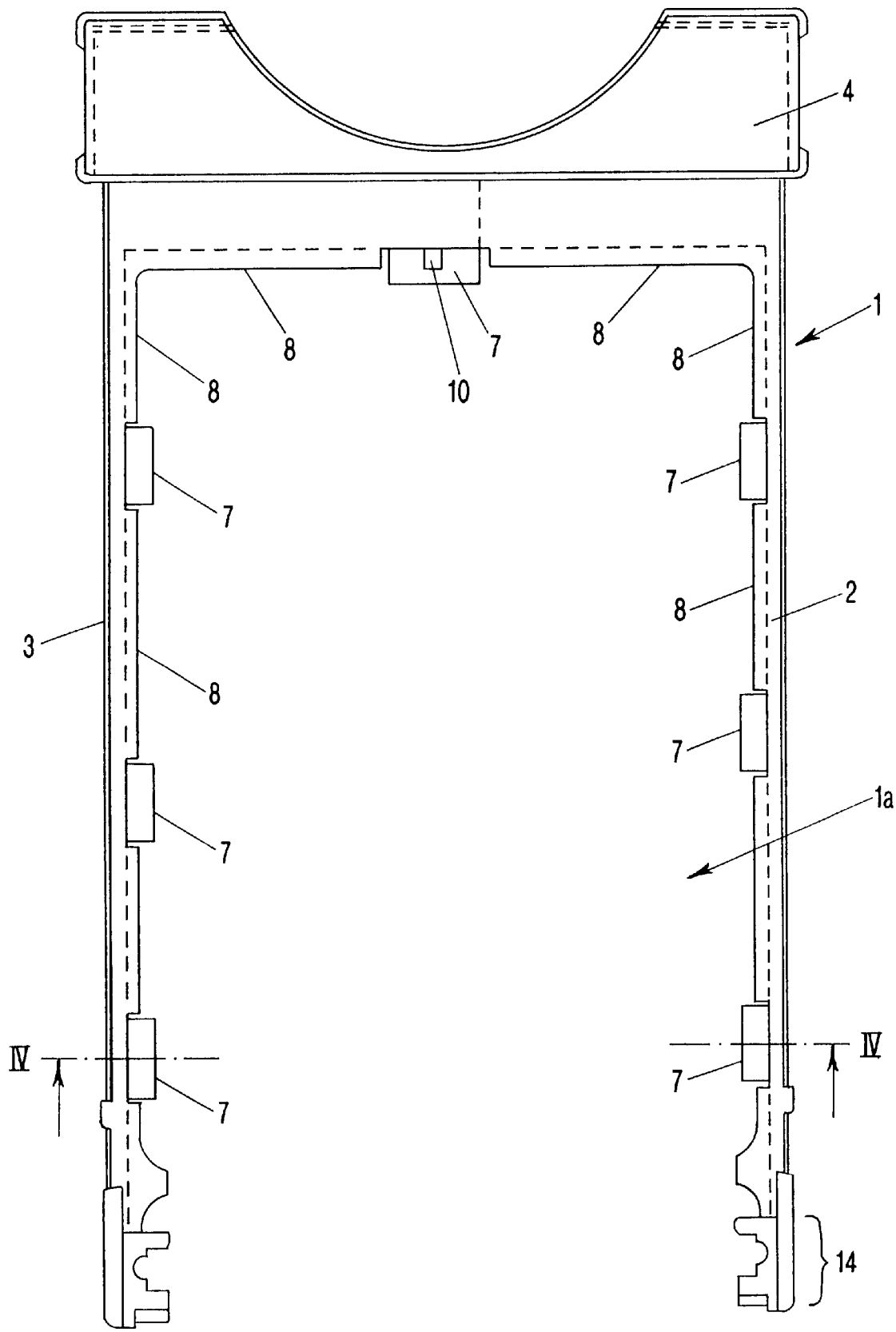
FIG. 1 shows a plan view of a plastic frame of a PC card housing.
Figure 3:
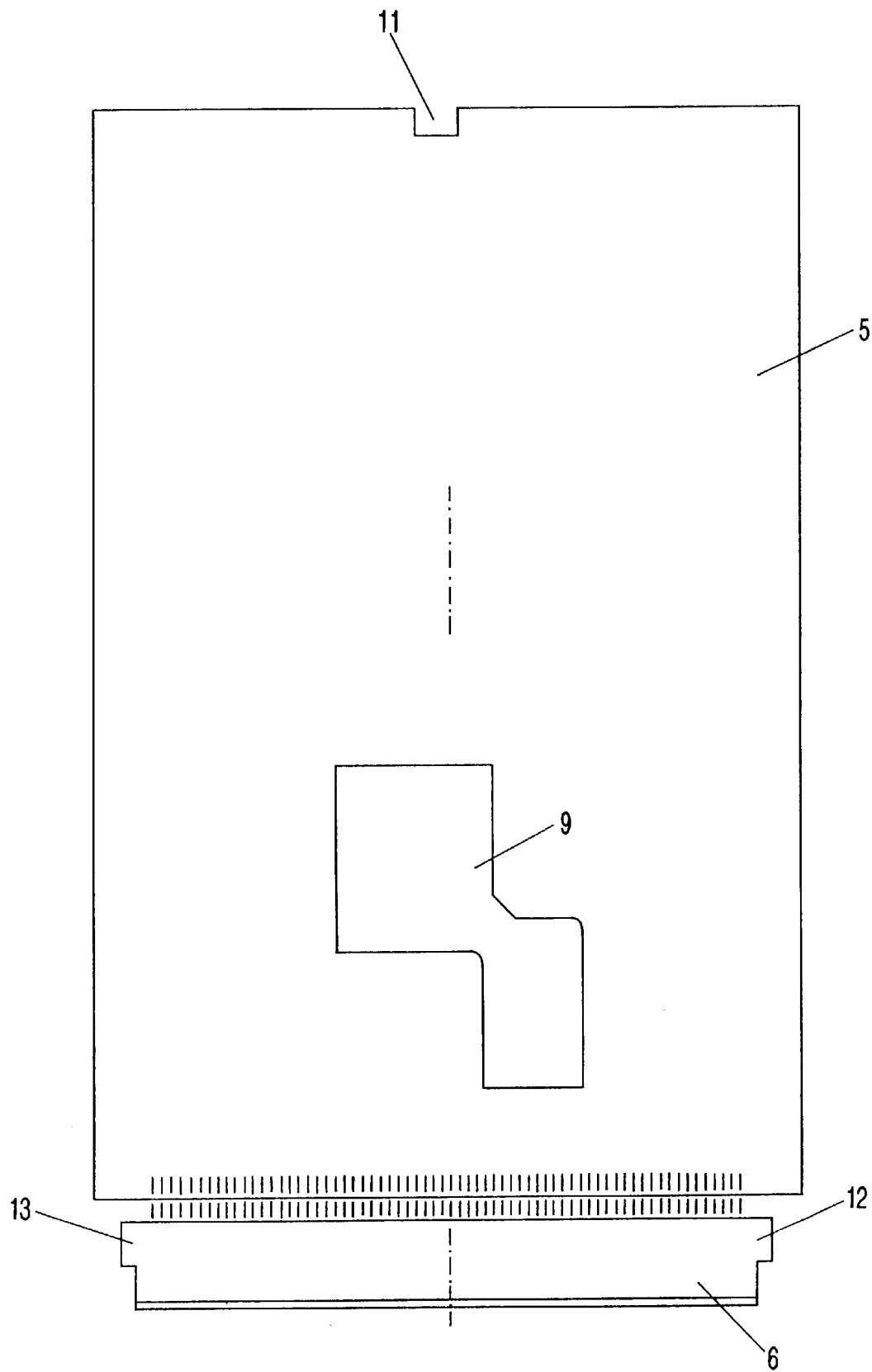
FIG. 3 shows a circuit board of a PC card with PCMCIA contact strip in a plan view.

The plastic frame 1 shown in a plan view in FIG. 1 has substantially a U-shape whereby parallel extending lateral arms 2,3 are connected by a transversely extending connecting stay 4 that can be a grip portion, and may be provided as an integral injection molded plastic part. The lateral arms 2,3 are flexible and can be preferably bent outwardly, respectively, can be bent in all directions in order to facilitate mounting. The plastic frame 1 is provided with an inner receiving space 1a so as to receive a printed circuit board 5 for securing the circuit board 5 therein without emplying an adhesive and such that it is fixed against displacement or removal as well as canting in the upward and in the downward direction (the frame being in a horizontal position, see FIG. 4). A printed circuit board 5 is shown in FIG. 3. It comprises in a conventional manner a printed circuit having connected thereto, for example, by soldering a plurality of electronic components 9. This is a known design and will therefore not be described in detail in this context. The leading end of the printed circuit board, when viewed in the direction of insertion, has a contact strip 6 which is provided with 68 PCMCIA pin contacts for connecting to a personal computer.

Figure 2:
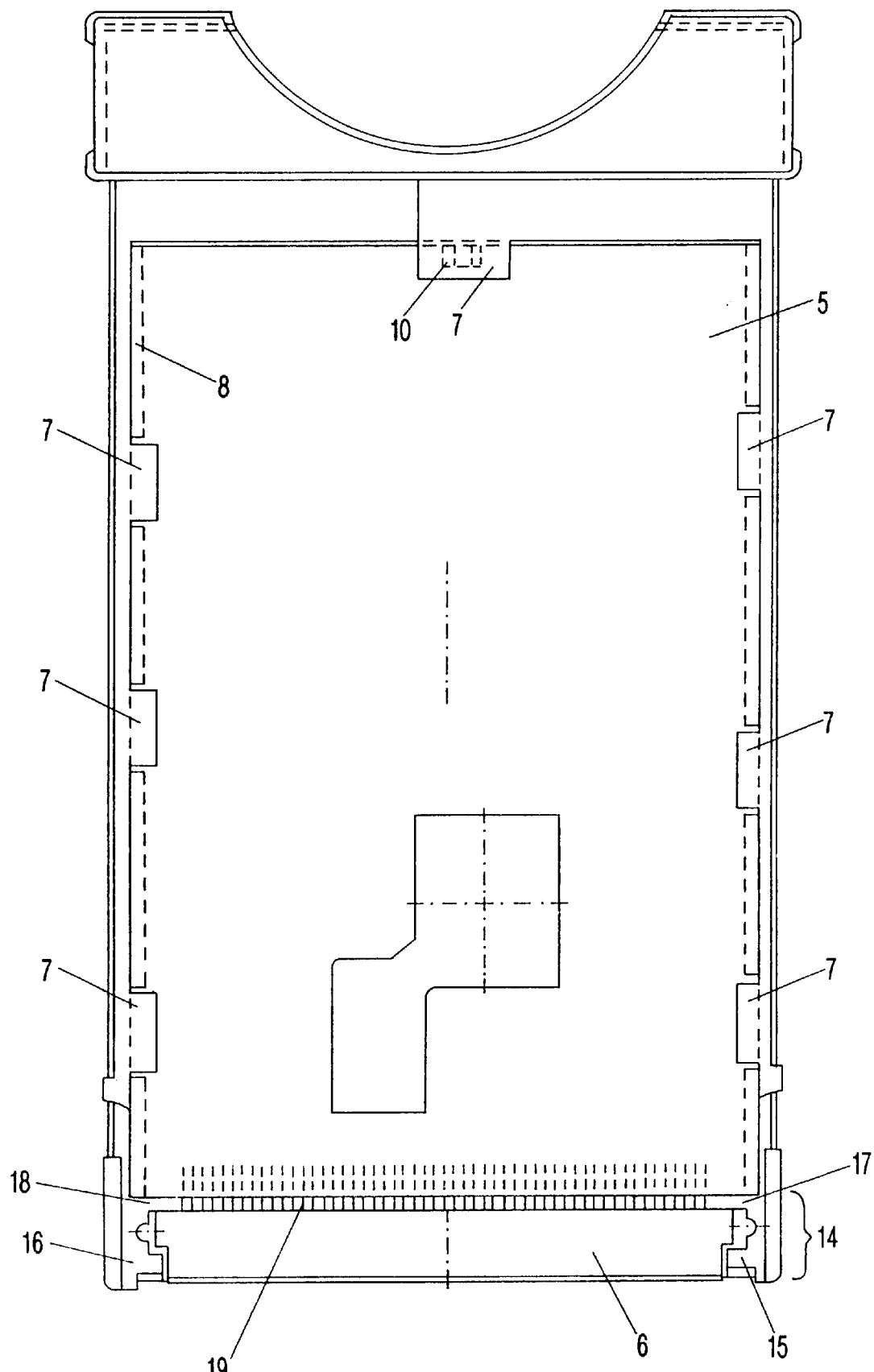
FIG. 2 shows a printed circuit board mounted the plastic frame in a view from below.

The printed circuit board 5 is shown on FIG. 2 in the inserted state within the plastic frame 1, whereby the plastic frame 1 serves as a protective cover for the printed circuit board 5 and provides a safe enclosure for the printed circuit board 5. The plastic frame is furthermore especially suitable to be inserted into a non-represented outer metal casing.

In order to secure the printed circuit board 5 without adhesive in an exact position within the plastic frame, the plastic frame 1 is provided with a guide arrangement for guiding the printed circuit board 5 such that after insertion into the inner receiving space 1a of the plastic frame 1 the printed circuit board 5 is precisely positioned and also fixed in the upward and downward direction. The guide arrangement is inwardly open and may be in the form of a continuously extending guide groove. In such an arrangement, which is not shown in the drawings, the printed circuit board 5 is inserted from the open side of the U-shaped plastic frame 1 into the guide groove until it abuts the end connecting stay 4 where dissecured in the transversely extending guide groove position provided thereat. According to another embodiment, the inwardly open guide arrangement is in the form of a discontinuous guide groove, also not represented. In this arrangement, bottom supports for the circuit board 5 to be inserted and upper counter holders are positioned congruently above one another when viewing the plastic frame 1 in a top view.

Figure 4:
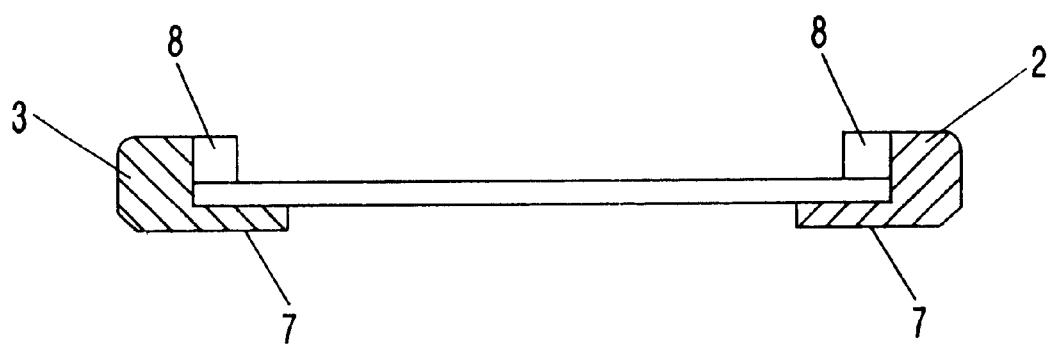
FIG. 4 shows a cross-sectional view along line IV—IV of FIG. 1.

In a preferred embodiment, which is represented in the drawing, a discontinuous guide arrangement is provided in which bottom supports 7 and upper counter holders 8 which are displaced relative to one another serve to secure the inserted printed circuit board 5 in its position. This can be clearly seen in FIG. 2 of the drawing in which a bottom view is shown illustrating how the printed circuit board 5 rests on the bottom supports 7 while FIG. 1 shows the upper counter holders 8 which are positioned staggered relative to the bottom supports 7. The bottom supports 7 and the counter holders 8 are spaced relative to one another at a spacing that is slightly greater than the thickness of the printed circuit board 5. It can also be seen in the drawing that the lower or bottom supports 7 project relatively far into the inner receiving space 1a in order to facilitate insertion of the printed circuit board 5 by improving guiding as well as by providing a proper support from below once the printed circuit board 5 has been inserted. For this purpose, the bottom supports 7 are to be seen as an extension of the lower guide side surface of the guide arrangement guide groove in the inward direction, as can be seen in FIG. 4 showing a cross-sectional view along the line IV—IV. In analogy thereto, additional upper inwardly projecting holding projections may be provided at one or more sides of the plastic frame 1, however, such holding projections are not shown in the drawing.

The connecting stay of the plastic frame 1 is provided in the area of the guide arrangement, somewhat off center, with a projection 10 in the form of an integrally formed plastic projection positioned directly above the bottom support 7. This plasitc projection cooperates with a corresponding cutout 11 of the printed circuit board 5. This projection-cutout arrangement provides a coding system which ensures during assembly that the respective matching plastic frame and the respective matching printed circuit board are combined. In addition thereto, similar codig projections and/or cutouts can be provided at the lateral arms 2,3 and at the lateral edges of the printed circuit board 5.

The leading end of the printed circuit board 5 in the direction of insertion into the computer part has a PCMCIA contact strip 6 which provides the actual contacting area to be inserted into the respective port of the computer, especially notebook, and via which the respective electric plug-in connection is realized. The contact strip 6 has at both ends a projection 12, 13 in the form of a step which is needed for positioning and fixation within the plastic frame 1. The lateral arms 2,3 of the plastic frame 1 have extensions 14 with inwardly extending forked holders 15,16 for completely engaging the contact strip 6. The forked holders 15,16 are of integral parts of the lateral arms 2,3 and engage the corresponding holding projections 12,13 of the printed circuit board 5 when assembled (compare FIG. 2.) Additionally, the rearward arms 17, 18 of the forked holders 15, 16 contacts the neighboring end face 19 of the printed circuit board 5 in order to provide a securing action against axial displacement of the printed circuit board 5 within the plastic frame.

The present invention is, of course, in no way restricted to the specific disclosure of the specification and drawings, but also encompasses any modifications within the scope of the appended claims.

What we claim is:

1. A personal computer card housing comprising:
   a U-shaped plastic frame comprised of flexible lateral arms and a connecting stay connecting said lateral flexible arms, wherein said flexible lateral arms and said connecting stay define a plane of said plastic frame and delimit an inner receiving space for a printed circuit board;
      said U-shaped plastic frame having an open end opposite said connecting stay for inserting a printed circuit board into said plastic frame;
      said plastic frame having a guide arrangement open inwardly relative to said inner receiving space;
         wherein said guide arrangement positions and secures a printed circuit board in said plastic frame laterally and in a direction perpendicular to said plane of said plastic frame after insertion of the printed circuit board into said inner receiving space;
   a metal casing, wherein said plastic frame, having a printed circuit board inserted therein, is mounted in said metal casing.

2. A personal computer card housing comprising:
   a U-shaped plastic frame comprised of flexible lateral arms and a connecting stay connecting said lateral flexible arms, wherein said flexible lateral arms and said connecting stay define a plane of said plastic frame and delimit an inner receiving space for a printed circuit board;
      said U-shaped plastic frame having an open end opposite said connecting stay for inserting a printed circuit board into said plastic frame;
      said plastic frame having a guide arrangement open inwardly relative to said inner receiving space;
         wherein said guide arrangement positions and secures a printed circuit board in said plastic frame laterally and in a direction perpendicular to said plane of said plastic frame after insertion of the printed circuit board into said inner receiving space;
      wherein each one of said flexible lateral arms has an extension at said open end of said plastic frame, said extension having a forked end for engaging securing projections at a contact strip of the printed circuit board inserted into said inner receiving space.

3. A housing according to claim 2, wherein said guide arrangement is a continuous groove that extends along said flexible lateral arms and along said connecting stay and opens inwardly.

4. A housing according to claim 2, wherein said guide arrangement is a discontinuous groove that extends along said flexible lateral arms and along said connecting stay and opens inwardly, wherein said discontinuous groove is comprised of bottom supports and counter holders.

5. A housing according to claim 4, wherein said counter holders are displaced relative to said bottom supports in a direction of longitudinal extension of said discontinuous groove.

6. A housing according to claim 4, wherein at least one of said bottom supports is located on each one of said flexible lateral arms and projects inwardly into said inner receiving space.

7. A housing according to claim 4, wherein a support surface of said bottom supports extends at the same level as a first side surface of said discontinuous groove, such that said support surface is an inwardly projecting continuation of said first side surface of said groove.

8. A housing according to claim 4, wherein at least one of said counter holders is located on at least one of said flexible lateral arms and said connecting stay and projects inwardly into said inner receiving space.

9. A housing according to claim 8, wherein a support surface of said counter holders extends at the same level as a second side surface of said discontinuous groove, such that said support surface is an inwardly projecting continuation of said second side surface of said groove.

10. A housing according to claim 2, wherein said connecting stay has an inward projection for cooperating with a cutout at a leading end of a printed circuit board received in said inner receiving space, wherein said inward projection provides a coding system together with the cutout at the printed circuit board.

11. A housing according to claim 2, wherein said flexible lateral arms have coding projections or coding cutouts for cooperating with coding cutouts or coding projections at lateral edges of the printed circuit board.

* * * * *

UNITED STATES PATENT AND TRADEMARK OFFICE
CERTIFICATE OF CORRECTION

PATENT NO. : 5,921,385
DATED : July 13, 1999
INVENTOR(S) : Stefan Plotz, et. al.

It is certified that error appears in the above-identified patent and that said Letters Patent is hereby corrected as shown below:

Title page, item
    [73] Assignee: Stocko Metallwarenfabriken Henkels und Sohn GmbH & Co.

Signed and Sealed this

Thirtieth Day of November, 1999

Attest:

Q. TODD DICKINSON

Attesting Officer

Acting Commissioner of Patents and Trademarks